US009466281B2

(12) United States Patent
Hoang Co Thuy et al.

(10) Patent No.: US 9,466,281 B2
(45) Date of Patent: Oct. 11, 2016

(54) ANC NOISE ACTIVE CONTROL AUDIO HEADSET WITH PREVENTION OF THE EFFECTS OF A SATURATION OF THE FEEDBACK MICROPHONE SIGNAL

(71) Applicant: PARROT, Paris (FR)

(72) Inventors: Vu Hoang Co Thuy, Paris (FR); Benoit Pochon, Paris (FR); Phong Hua, Paris (FR); Pierre Guiu, Paris (FR)

(73) Assignee: PARROT, Paris (FR)

( * ) Notice: Subject to any disclaimer, the term of this patent is extended or adjusted under 35 U.S.C. 154(b) by 0 days.

(21) Appl. No.: 14/692,541

(22) Filed: Apr. 21, 2015

(65) Prior Publication Data

US 2015/0332662 A1 Nov. 19, 2015

(30) Foreign Application Priority Data

May 16, 2014 (FR) ..................................... 14 54406

(51) Int. Cl.

*G10K 11/16* (2006.01)
*H03B 29/00* (2006.01)
*G10K 11/175* (2006.01)
*H04R 1/10* (2006.01)
*H04R 5/033* (2006.01)

(52) U.S. Cl.

CPC ........... *G10K 11/175* (2013.01); *H04R 1/1008* (2013.01); *H04R 1/1083* (2013.01); *H04R 5/033* (2013.01); *H04R 2420/01* (2013.01)

(58) Field of Classification Search

None

See application file for complete search history.

(56) References Cited

U.S. PATENT DOCUMENTS

2012/0310637 A1* 12/2012 Vitte .................. G10L 21/0208 704/226
2013/0129105 A1* 5/2013 Hua .................... H04R 1/1083 381/71.6

FOREIGN PATENT DOCUMENTS

EP 2518724 A1 10/2012
WO 0021194 A1 4/2000
WO 2011157856 A2 12/2011

* cited by examiner

*Primary Examiner* — Regina N Holder
(74) *Attorney, Agent, or Firm* — Haverstock & Owens LLP

(57) ABSTRACT

The headset includes an active noise control, with an internal ANC microphone (28) placed inside the acoustic cavity (22) and delivering a signal including an acoustic noise component. A digital signal processor DSP (50) comprises a feedback ANC branch (54) applying a filtering transfer function (54, $H_{FB2}$) to the signal delivered by the ANC microphone, and a mixer (60) for mixing the signal of the feedback branch with an audio signal to be reproduced (M). The headset comprises a movement sensor (64) mounted on one of the earphones. The DSP comprises an anti-saturation module (68) for analyzing concurrently i) the signal delivered by the internal microphone (28) and ii) the signal delivered by the movement sensor (64), and verifying whether current characteristics of these signals fulfill or not a set of predetermined criteria. Upstream from the feedback ANC filter (54), an anti-saturation filter (70, $H_{FB1}$) is selectively switched as a function of the result of this verification. The filtering of an equalization branch (58, $H_{EQ2}$) of the signal to be reproduced (M) is also modified by a similar anti-saturation filter (72, $H_{EQ1}$).

8 Claims, 5 Drawing Sheets

ANC NOISE ACTIVE CONTROL AUDIO HEADSET WITH PREVENTION OF THE EFFECTS OF A SATURATION OF THE FEEDBACK MICROPHONE SIGNAL

The invention relates to an audio headset comprising an "active noise control" system.

Such a headset may be used for listening an audio source (music for example) coming from an apparatus such as MP3 player, radio, smartphone, etc., to which it is connected by a wireline connection or by a wireless connection, in particular a Bluetooth link (registered trademark of Bluetooth SIG).

If provided with a microphone set adapted to pick up the voice of the headset wearer, this headset may also be used for functions of communication such as "hands-free" phone functions, as a complement of audio source listening. The headset transducer then reproduces the voice of the remote speaker with which the headset wearer is in conversation.

The headset generally comprises two earphones linked by a headband. Each earphone comprises a closed casing housing a sound reproduction transducer (simply called "transducer" hereinafter) and intended to be applied around the user's ear with interposition of a circumaural pad isolating the ear from the external sound environment.

There also exists earphones of the "intra-aural" type, with an element to be placed in the ear canal, hence having no pad surrounding or covering the ear. In the following, it will mainly be referred to earphones of the "headset" type with a transducer housed in a casing surrounding the ear ("circumaural" headset) or in rest on the latter ("supra-aural" headset), but this example must not be considered as being limitative, as the invention can also be applied, as will be understood, to intra-aural earphones.

When the headset is used in a noisy environment (metro, busy street, train, plane, etc.), the wearer is partially protected from the noise by the headset earphones, which isolate him thanks to the closed casing and to the circumaural pad.

However, this purely passive protection is only partial, as a portion of the sounds, in particular in the low portion of the frequency spectrum, can be transmitted to the ear through the earphones casing, or via the wearer's cranium.

That is why so-called "Active Noise Control" or ANC techniques have been developed, whose principle consists in picking up the incident noise component and in superimposing, temporally and spatially, to this noise component an acoustic wave that is ideally the inverted copy of the pressure wave of the noise component. The matter is to create that way a destructive interference with the noise component and to reduce, ideally neutralize, the variations of pressure of the spurious acoustic wave.

The EP 2 597 889 A1 (Parrot) describes such a headset, provided with an ANC system combining closed-loop feedback and open-loop feedforward filtering types. The feedback filtering path is based on a signal collected by a microphone placed inside the acoustic cavity delimited by the earphone casing, the circumaural pad and the transducer. In other words, this microphone is placed near the user's ear, and receives mainly the signal produced by the transducer and the residual noise signal, not neutralized, still perceptible in the front cavity. The signal of this microphone, from which is subtracted the audio signal of the music source to be reproduced by the transducer, constitutes an error signal for the feedback loop of the ANC system. The feedforward filtering path uses the signal picked up by the external microphone collecting the spurious noise existing in the immediate environment of the headset's wearer. Finally, a third filtering path processes the audio signal coming from the music source to be reproduced. The output signals of the three filtering paths are combined and applied to the transducer to reproduce the music source signal associated to a surrounding noise suppression signal.

The EP 2 518 724 A1 (Parrot) describes a device of the combined micro/headset type, usable in particular for "hands-free" phone functions. The headset is provided with a physiological sensor applied against the cheek or the temple of the headset wearer and collecting vocal vibrations that have the characteristic to be, by nature, very little corrupted by the surrounding noise. The physiological sensor may be in particular an accelerometer placed on the inner face of the skin of the pad of the headset earphone, so as to come in application against the cheek or the temple of the user with the closer possible coupling. The hence-collected signal allows, after filtering and combination with signals picked up by conventional external microphones, to deliver to the communication system a speech signal of the close speaker (the headset wearer), whose intelligibility will have been greatly improved. Another advantage of this sensor is the possibility to use the signal delivers therefrom to calculate a cut frequency of a dynamic filter.

The WO 2010/129219 A1 (EP 2 425 421 A0) describes another device, comprising an ANC system of the adaptive type, i.e. using filters whose transfer function is dynamically and continuously modified by an algorithm for analysing the signal in real time. An external microphone placed on the casing of the headset earphones collects the ambient noises, whose level is analysed to adjust the transfer function of the feedback filter, so as to adapt to the noise existing in the external environment of the headset.

The existing ANC systems are subjected to a phenomenon appearing when the internal acoustic cavity of the earphone undergoes abrupt compressions and decompressions, which are inaudible but whose amplitude is so high that the membrane of the microphone is abruptly squeezed and produces an electric signal exceeding its nominal limit.

This phenomenon occurs in particular during the handling of the headset, or when the user walks heavily or runs. The movements of the headset then create excessive overpressures or depressions in the front cavity, which translates into a high electric peak in the low frequencies. The excessive signal picked up by the microphone creates in the feedback ANC filter a saturation leading to an audible signal or "plop" produced at the output of the transducer and unpleasant for the user.

This phenomenon may even occur in normal walking conditions, where step noise resonances in low frequencies below 100 Hz are heard and are sometimes cumbersome. The feedback ANC filter may attenuate these step noise resonances by amplifying the signal of the internal microphone but, when the steps become heavier, the electric level of the microphone signal may exceed the limits of its normal operation and cause, here again, a saturation of the ANC filter and the transducer.

This saturation may intervene at several locations of the signal processing chain: electric exceeding of the input dynamics of the analog/digital converter, exceeding of the maximum digital value in the digital signal processor DSP, or output saturation if the signal reproduced by the transducer exceeds the maximum value that the digital/analog converter may produce, each of these phenomena being liable to cause an unpleasant "plop".

The object of the invention is to propose a new ANC noise reduction technique allowing to compensate for these phenomena:

by compensating for the pneumatic phenomena of overpressure/depression in the acoustic cavity of the earphone, in particular due to the step movements of the headphone user;

without degradation of the anti-noise performance of the ANC system, that is to say that the residual noise perceived by the user will always be reduced at best, with in particular i) a strong attenuation of the low frequencies and ii) a large frequency suppression bandwidth;

the whole, without the audio signal coming from the music source (or the remote speaker voice, in a telephony application) be distorted, and without the spectrum of this signal is amputated by the ANC processing although the noise neutralization signal and the audio signal to be reproduced are amplified by the same channel and reproduced by the same transducer.

Another object of the invention is to implement a digital technology (and not an analog technology as in the above-mentioned EP 2 597 889 A1) for such an ANC system, implementable in particular within a digital signal processor (DSP).

To achieve these objects, the invention proposes an audio headset as disclosed by the above-mentioned EP 2 518 724 A1. Such a headset comprises:

two earphones each including a transducer for the sound reproduction of an audio signal to be reproduced, this transducer being housed in an acoustic cavity of the ear;

at least one microphone adapted to deliver a picked-up signal including an acoustic noise component;

a movement sensor mounted on at least one of the earphones and adapted to deliver an accelerometer signal; and a digital signal processor, DSP, comprising:

mixing means, receiving as an input a signal coming from the microphone as well as said audio signal to be reproduced, and delivering as an output a signal adapted to pilot the transducer; and noise reduction means, comprising means adapted to analyse concurrently i) the microphone signal delivered by the microphone and ii) the accelerometer signal delivered by the movement sensor, and to verify whether current characteristics of these microphone and accelerometer signals fulfil or not a first set of predetermined criteria.

Characteristically of the invention:

the headset comprises an ANC active noise control system;

the microphone is an internal ANC microphone placed inside the acoustic cavity;

the DSP comprises:

a closed-loop feedback branch, comprising a feedback ANC filter adapted to apply a filtering transfer function to the signal delivered by the internal ANC microphone; and said mixing means, which receive as an input the signal delivered by the feedback branch at the output of the feedback ANC filter as well as said audio signal to be reproduced, and deliver as an output said signal adapted to pilot the transducer; and the DSP further comprises means for preventing the effects on the feedback branch of a saturation of the signal delivered by the internal microphone, comprising:

said means adapted to analyse concurrently i) the microphone signal delivered by the microphone and ii) the accelerometer signal delivered by the movement sensor, and to verify whether current characteristics of these microphone and accelerometer signals fulfil or not a first set of predetermined criteria; and in the feedback branch upstream from the feedback ANC filter, a feedback anti-saturation filter selectively switchable as a function of the result of the verification of the first set of criteria.

According to various advantageous subsidiary characteristics:

the feedback anti-saturation filter is one between a plurality of selectively switchable, pre-configured filters, and the DSP further comprises means adapted to select one of the pre-configured anti-saturation filters as a function of the result of the verification of the first set of criteria;

the DSP further comprises: an equalization branch, comprising an equalization filter adapted to apply an equalization transfer function to the audio signal to be reproduced before application of the latter to the mixing means; and in the equalization branch, upstream from the equalization filter, an equalization anti-saturation filter that is selectively switchable at the same time as the feedback anti-saturation filter;

the equalization anti-saturation filter is one between a plurality of selectively switchable, pre-configured equalization filters, and the DSP further comprises means adapted to select one of the pre-configured equalization filters as a function of the result of the verification of the first set of criteria;

the current characteristics of the accelerometer signal comprise a value of energy of the accelerometer signal, and the predetermined criteria comprise a threshold to which is compared said value of energy. It may in particular be values of energy in a plurality of respective frequency bands, the predetermined criteria comprising a series of respective thresholds to which are compared these energy values if the value of energy of the accelerometer signal exceeds the threshold;

the feedback ANC filter is one between a plurality of selectively switchable, pre-configured feedback ANC filters, and the DSP further comprises: means for analysing the signal delivered by the internal microphone, adapted to verify whether current characteristics of the signal delivered by the internal microphone fulfil or not a second set of predetermined criteria; and selection means, adapted to select one of the pre-configured feedback ANC filters as a function of the result of the verification of the second set of criteria;

the DSP further comprises an equalization branch, comprising an equalization filter adapted to apply an equalization transfer function to the audio signal to be reproduced before application of the latter to the mixing means. The equalization filter is one between a plurality of selectively switchable, pre-configured equalization filters, and the selection means are also adapted to select one of the pre-configured equalization filters as a function of the current selected feedback ANC filter.

An example of embodiment of the invention will now be described, with reference to the appended drawings in which the same references denote identical or functionally similar elements throughout the figures.

FIG. 1 generally illustrates an audio headset on the head of a user.

Figure 5:
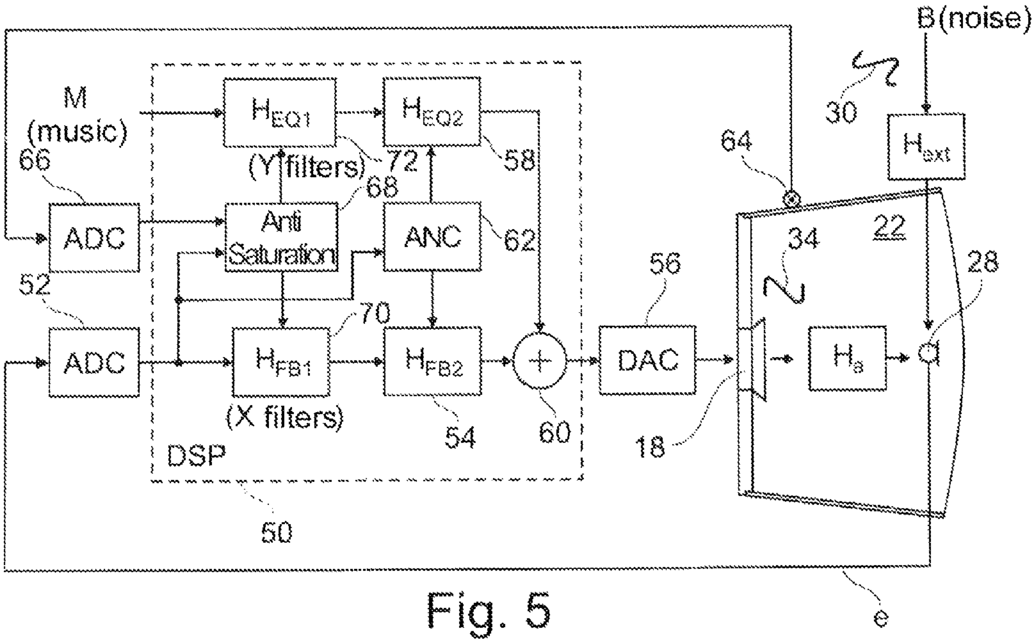

FIG. 5 schematically illustrates, as functional blocks, the way the denoising processing according to the invention is performed.

Figure 6:
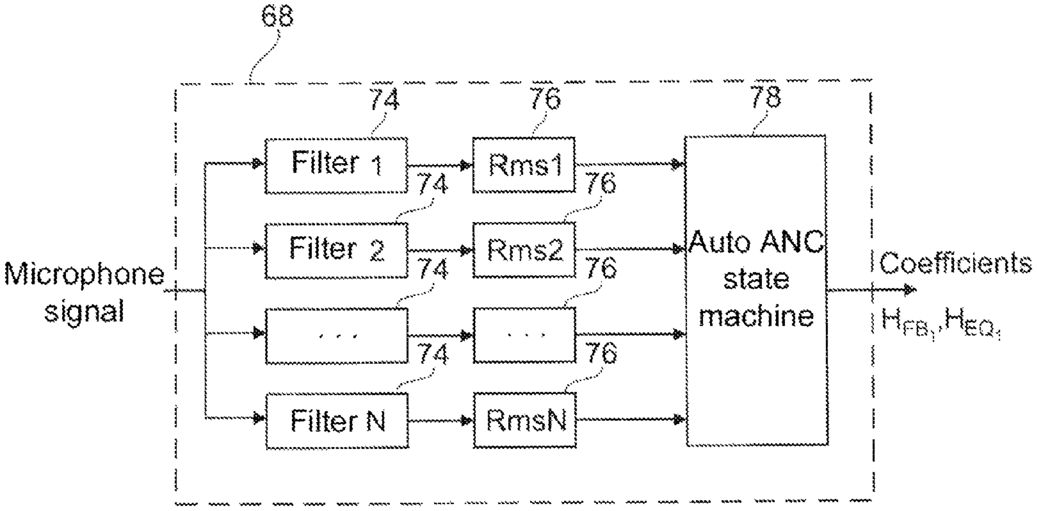

FIG. 6 illustrates more precisely the elements implementing the function of analysis of the microphone signal and of selection of the filters to be applied to the signals delivered to the headset transducer.

Figure 7:
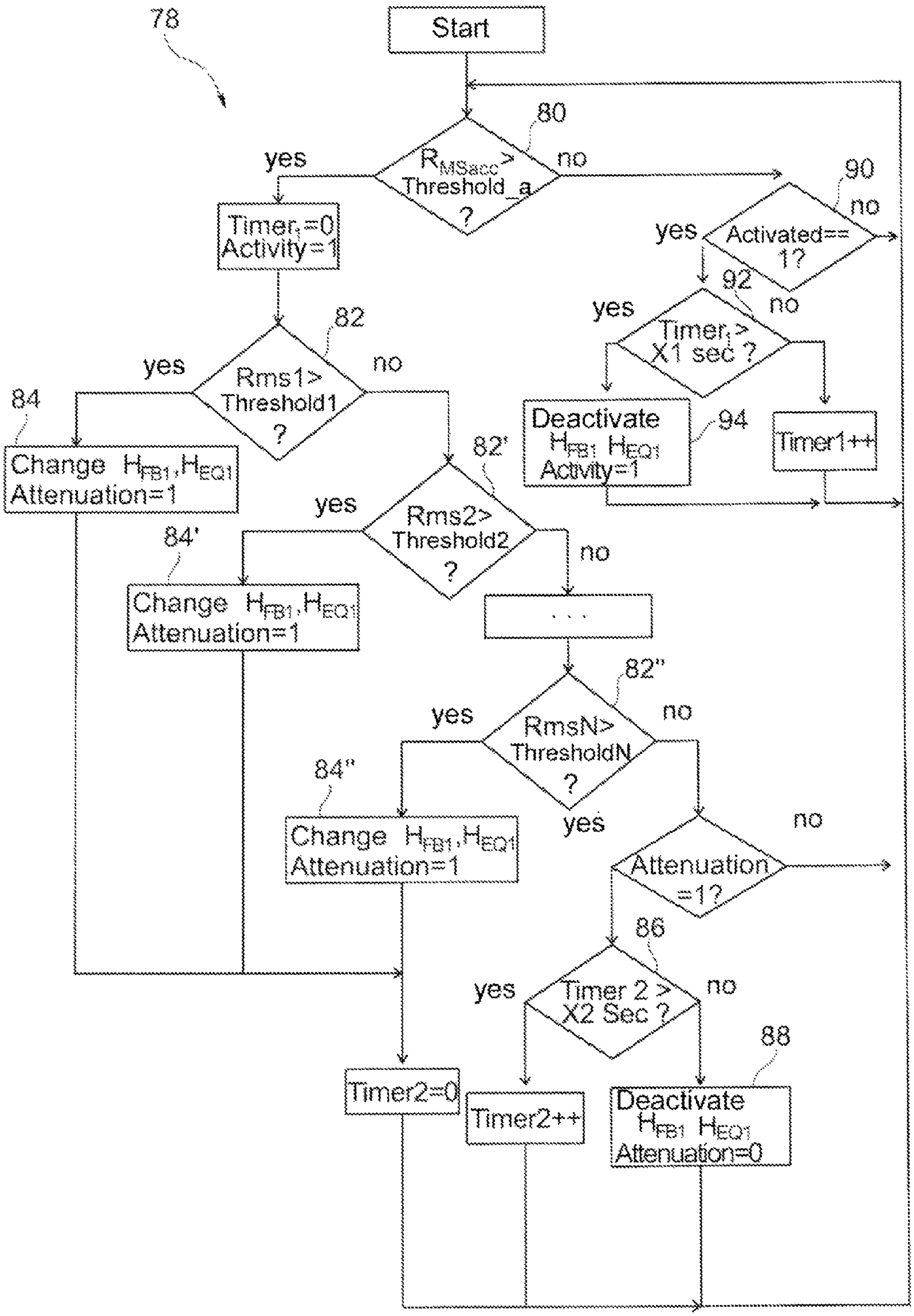

FIG. 7 is a flow chart describing the operation of the state machine of the function of analysis and selection of FIG. 6.

Figure 8:
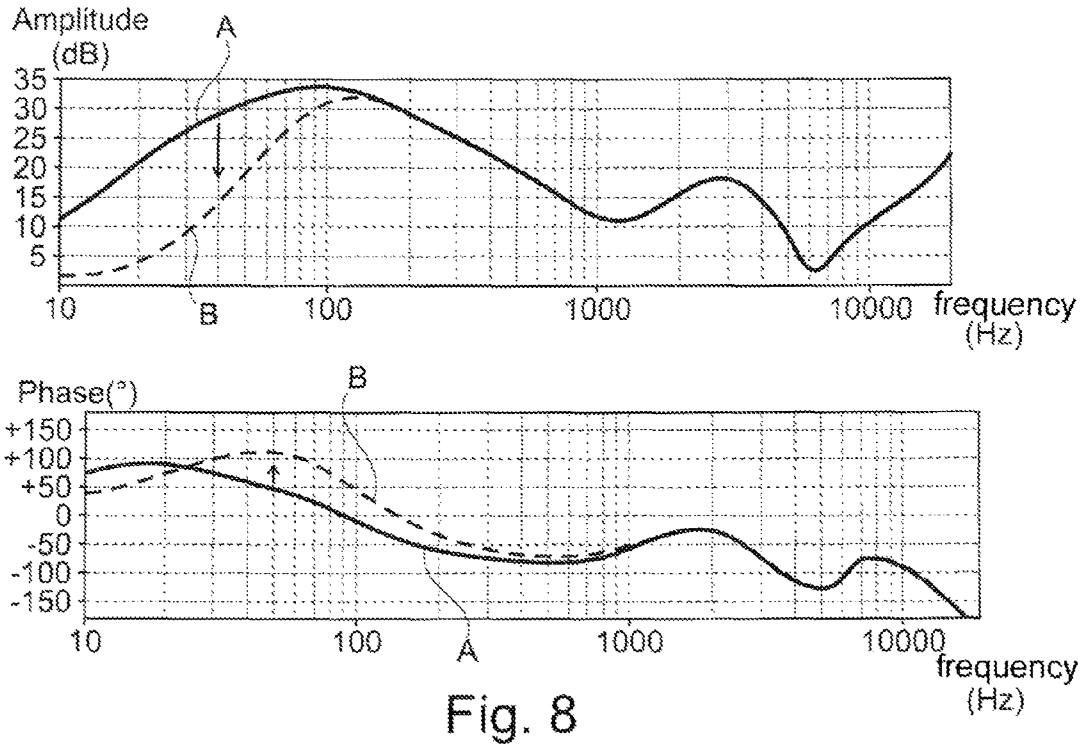

FIG. 8 shows, in amplitude and phase, the transfer functions of the ANC filter with and without the anti-saturation filtering according to the invention, automatically selected as a function of the detected movements.

Figure 9:
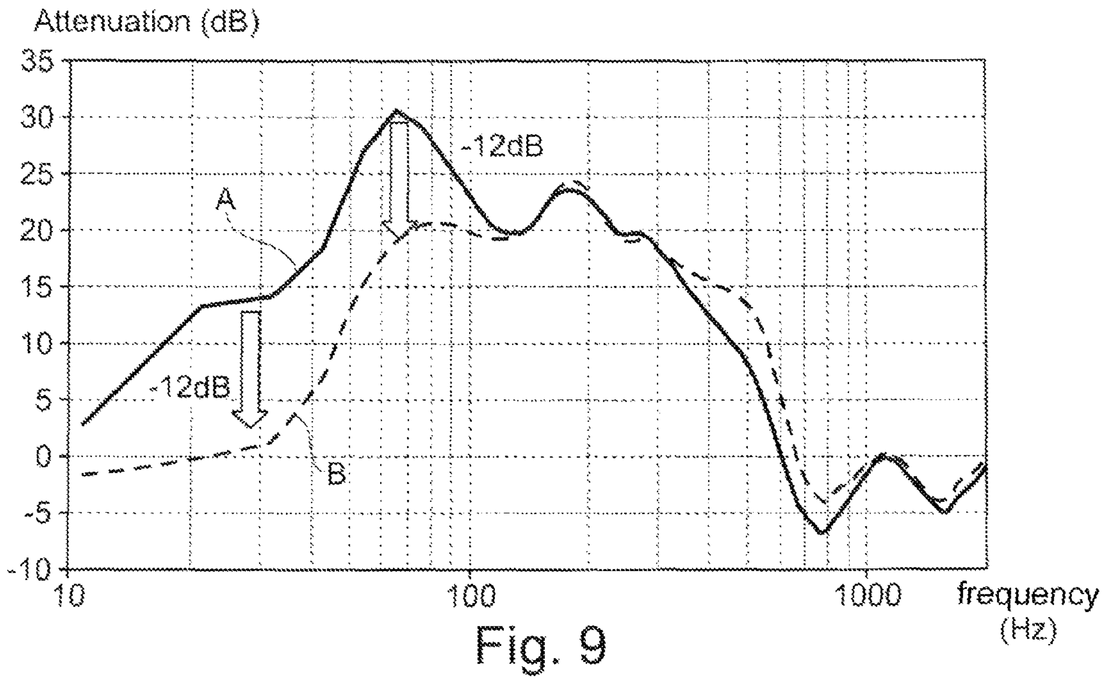

FIG. 9 illustrates examples of attenuation obtained in the two cases exemplified in FIG. 8.

Figure 1:
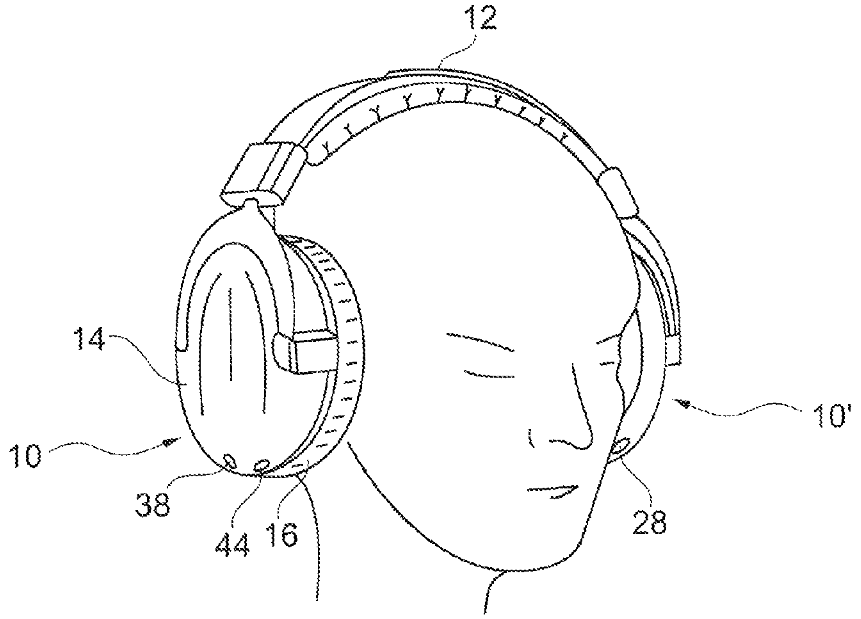

In FIG. 1 is shown an audio headset placed on the head of the user thereof. This headset includes, in a manner conventional per se, two earphones 10, 10' linked by a holding headband 12. Each of the earphones 10 comprises an external casing 14 coming on the user's ear contour, with interposition between the casing 14 and the ear periphery a circumaural flexible pad 16 intended to ensure a satisfying tightness, from the acoustic point of view, between the ear region and the external sound environment. As indicated in introduction, this example of configuration of the "headset" type with a transducer housed in a casing surrounding the ear or in rest on the latter must not be considered as being limitative, as the invention can also be applied to intra-aural earphones comprising an element to be placed in the ear canal, hence earphones devoid of casing and pad surrounding or covering the ear.

Figure 2:
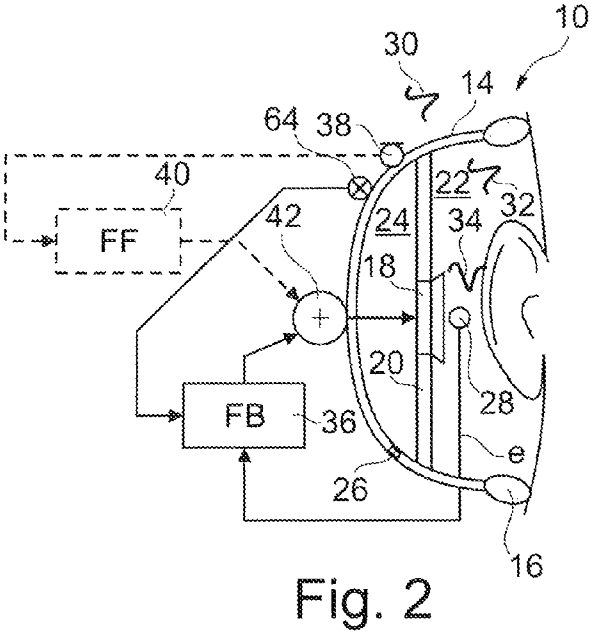
FIG. 2 is a schematic representation showing the different acoustic and electrical signals as well as the various functional blocks involved in the operation of an active noise control audio headset.

FIG. 2 is a schematic representation showing the different acoustic and electrical signals as well as the various functional blocks involved in the operation of an active noise control audio headset.

The earphone 10 encloses an sound reproduction transducer 18, hereinafter simply called "transducer", carried by a partition 20 defining two cavities, i.e. a front cavity 22 on the ear side and a rear cavity 24 on the opposite side.

The front cavity 22 is defined by the inner partition 20, the wall 14 of the earphone, the pad 16 and the external face of the user's head in the ear region. This cavity is a closed cavity, except the inevitable acoustic leakages in the region of contact of the pad 16. The rear cavity 24 is a closed cavity, except for an acoustic vent 26 allowing to obtain a reinforcement of the low frequencies in the front cavity 22 of the earphone.

Finally, for the active noise control, an internal microphone 28 is provided, placed the closest possible to the ear canal, to pick-up the residual noise present in the internal cavity 22, a noise that will be perceived by the user. Leaving aside the audio signal of the music source reproduced by the transducer (or the remote speaker voice, in a telephony application), the acoustic signal picked up by this internal microphone 28 is a combination:

- of the residual noise 32 coming from the transmission of the surrounding external noise 30 through the earphone casing 14, and
- a sound wave 34 generated by the transducer 18, which is, ideally according to the principle of the destructive interferences, the inverted copy of the residual noise 32, i.e. of the noise to be suppressed at the listening point.

The noise neutralization by the sound wave 34 being never perfect, the internal microphone 28 collects a residual signal that is used as an error signal e applied to a closed-loop feedback filtering branch 36.

Potentially, an external microphone 38 may be placed on the casing of the headset earphones, to pick up the surrounding noise outside the earphone, schematised by the wave 30. The signal collected by this external microphone 38 is applied to a feedforward filtering stage 40 of the active noise control system. The signals coming from the feedback branch 36, and, if present, from the feedforward branch 40, are combined in 42 to pilot the transducer 18.

Furthermore, the transducer 18 receives an audio signal to be reproduced coming from a music source (Walkman, radio, etc.), or the remote speaker voice, in a telephony application. As this signal undergoes the effects of the closed bop that distorts it, it will have to be pre-processed by an equalization so as to have the desired transfer function, determined by the gain of the open loop and the target response with no active control.

The headset may possibly carry, as illustrated in FIG. 1, another external microphone 44 intended for communication functions, for example if the headset is provided with "hands-free" phone functions. This additional external microphone 44 is intended to pick up the voice of the headset wearer, it does not intervene in the active noise control, and, in the following, it will be considered as an external microphone potentially used by the ANC system only the microphone 38 dedicated to the active noise control.

Figure 3:
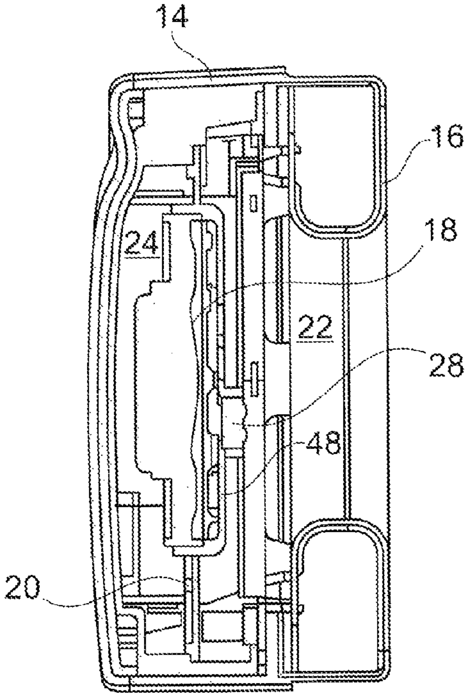
FIG. 3 is a sectional view in elevation of one of the earphones of the headset according to the invention, showing the configuration of the various mechanical elements and electromechanical members thereof.

FIG. 3 illustrates, in a sectional view, an exemplary embodiment of the different mechanical and electroacoustic elements schematically shown in FIG. 2 for one of the earphones 10 (the other earphone 10' being made identical). We can see therein the partition 20 dividing the inside of the casing 14 into a front cavity 22 and a rear cavity 24 with, mounted on this partition, the transducer 18 and the internal microphone 28 carried by a grid 48 holding the latter close to the ear canal of the user.

The object of the invention is to compensate for the phenomenon, exposed in introduction, resulting from the abrupt overpressures/depressions in the front cavity 22, which are liable to produce, in particular in the low frequencies below 100 Hz, extreme exceedings of the value of the signal delivered by the internal microphone 28.

Figure 4:
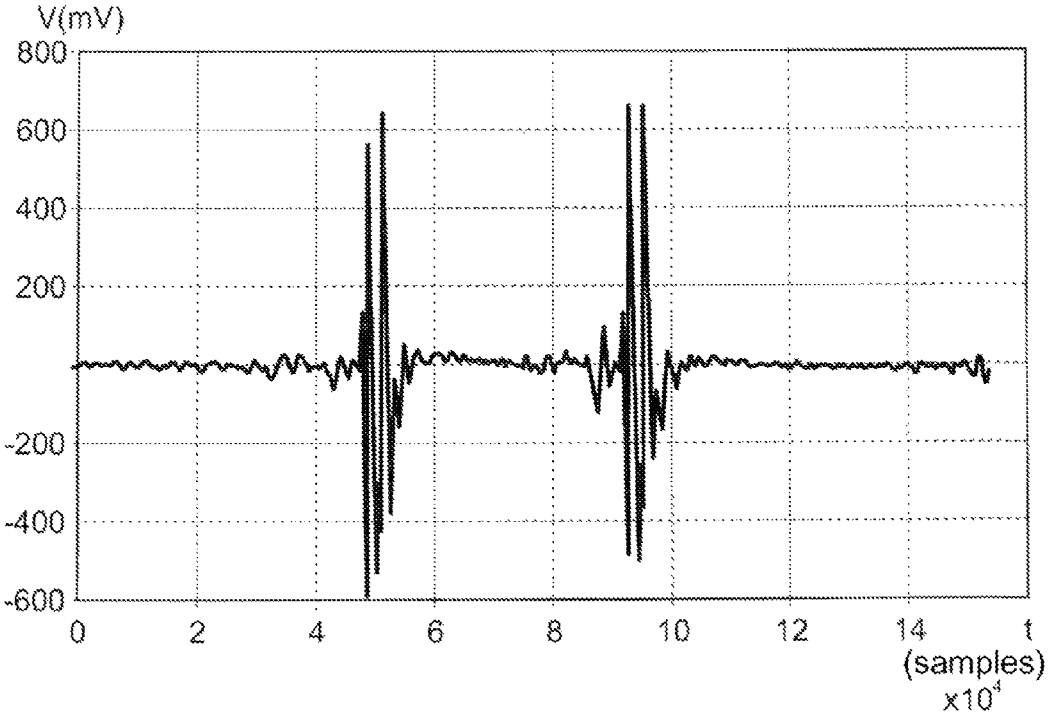
FIG. 4 illustrates an example of typical waveform of the electric signal delivered before amplification by the internal microphone of an ANC headset, during two jumps of the headset wearer.

Hence, FIG. 4 illustrates an example of signal delivered by the internal microphone 28, here an electret microphone that delivers a signal not exceeding 100 mV for an acoustic pressure of 110 dB SPL (Sound Pressure Level). However, as illustrated in FIG. 4, in the case of two small successive jumps, it is observed that this value may be very widely exceeded (in the example, it reaches and exceeds 600 mV), which may produce after amplification effects of saturation in various locations of the processing chain.

The basic idea of the invention is to detect upstream from the feedback filter, with a very low latency, the situations liable to produce such signal peaks, in order to avoid all the saturation phenomena during the abrupt movements of the headset, in particular with the user walks or runs.

FIG. 5 schematically illustrates, as functional blocks, the ANC active noise control system incorporating, according to the invention, an anti-saturation function allowing to compensate for this phenomenon.

It is an ANC system of the digital type, implemented by a digital signal processor DSP 50. It will be noted that, although these schemes are presented as interconnected circuits, the implementation of the different functions is essentially software-based, this representation being only illustrative.

We can also see therein the feedback branch whose principle has been described hereinabove with reference to FIG. 2, after digitization by means of an ADC converter 52 of the error signal e picked up by the internal microphone 28. The digitized error signal is processed by a feedback filter 54, then converted into an analog signal by the DAC 56, so as to be rendered by the transducer 18 in the cavity of the earphone 10. The reproduced signal is possibly combined to a music signal M that, after equalization in 58, is combined in 60 to the noise cancelling signal, for conversion by the DAC 56 and reproduction by the transducer 18.

The filtering operations performed by the blocks 54 (feedback transfer function $H_{FB2}$ on the microphone signal) and 58 (transfer function $H_{EQ2}$ for equalizing the music M) may be performed in particular as described in the application FR 14 53284 of 11.04.2014, in the name of the present Applicant, entitled "Casque audio à contrôle actif de bruit ANC avec réduction du souffle électrique", which proposes to implement a plurality of selectively switchable, preconfigured filter configurations, as a function of the signal picked up by the internal microphone 28, so as to optimize the compromise between the more or less high attenuation of the surrounding noise and that of an electric hiss also more or less high, as a function of the level and spectral content of the signal rendered to the user, as picked up by the microphone 28 placed in the front cavity 22 of the earphone.

This particular anti-hiss filtering technique is however not limitative in any way, and the anti-saturation system according to the invention also applies to feedback and equalization filtering operations performed by other techniques.

In the illustrated example, the ANC active noise control is controlled by an ANC module 62, which analyses the signal e and adapts consequently the transfer functions $H_{FB2}$ of the feedback branch 54 and $H_{EQ2}$ of the music signal equalization branch 58.

More precisely, the signal e picked up by the internal microphone 28 (that is supposed to be identical to the signal picked up by the ear of the headset user) is (in the configuration of FIG. 5) given by:

$$e=H_{ext}/(1-H_a*H_{FB2})*B+H_a/(1-H_a*H_{FB2})*H_{EQ2}*M$$

B being the external noise signal 30,

M being the input music signal, $H_{ext}$ being the transfer function between an external noise source and the internal microphone 28, $H_{FB2}$ being the transfer function of the feedback filter 54, $H_{EQ2}$ being the transfer function of the equalization filter 58, and $H_a$ being the transfer function between the transducer 18 and the internal microphone 28.

In this equation, it can be observed that a music signal played is subjected to a transfer function:

$$H_a/(1-H_a*H_{FB})*H_{EQ2}$$

so that, if the filter $H_{FB2}$ of the feedback ANC branch 54 is modified, the perception of the music by the user is also modified. In order for the perception of the music to remain the same, the ANC control algorithm 62 modifies the filter $H_{EQ2}$ of the music equalization branch 58 at the same time as that of the feedback ANC branch 54, to re-equilibrate the effects of the filtering, of course if a music signal is present.

Characteristically of the invention, jointly to the signal of the internal microphone 28, the ANC noise active control processing involves an accelerometer 64 mounted on the headset (FIGS. 2 and 5), whose role will be to detect with a very low latency the earphone movements liable to produce effects of saturation of the signal picked up by the internal microphone 28, typically movements resulting from displacements of the user when the latter walks, runs, jumps . . . or when the latter handles the earphones, for example to readjust the position thereof on his ears.

The EP 2 518 724 A1 (Parrot) describes a headset comprising an accelerometer integrated to an earphone, but in this document the accelerometer is used as a physiological sensor to collect non-acoustic voice components transmitted by bone conduction, hence not noisy, of a voice signal emitted by the user, for example in the case where the headset is used as a "hands-free" device in combination with a portable phone. In the case of the present invention, this same accelerometer may be used, but with a different role, i.e. improving the ANC function of the headset, in a listening configuration (sound reproduction) and not a voice configuration (user's voice).

The accelerometer signal 64, after digitization by means of an ADC converter 66, is applied to an "anti-saturation" module 68 that also receives the signal e collected by the internal microphone 28, after digitization by the ADC converter 52.

The two acceleration and microphone signals are analysed jointly by the anti-saturation module 68, which controls a filter 70 (transfer function $H_{FB1}$) placed in the feedback branch upstream from the feedback filtering itself (block 54, transfer function $H_{FB2}$), and likewise an equalization filter 72 (transfer function $H_{EQ1}$) placed in the equalization branch upstream from the equalization filter (block 58, transfer function $H_{EQ2}$).

Very advantageously, but in a non-limitative way, it is possible to provide, for the blocks 70 and 72 defining respectively the transfer functions of the feedback and equalization branches, a plurality of selectively switchable, predetermined filtering configurations, with a smart mechanism of swapping between these different filters as a function of the signal jointly picked up by the accelerometer 64 and the internal microphone 28.

The anti-saturation module 68, based on these signals, defines that of the X filters of the block 70 of the feedback branch it is advisable to select and, likewise, that of the Y filters of the block 72 of the music signal equalization branch it is advisable to select (wherein Y can be, but not necessarily, equal to X).

The selection between the X filters of the transfer function $H_{FB1}$ of the block 70 (or of the Y filters of the transfer function $H_{EQ1}$ of the block 72) is made as follows.

For each of the filters, the parameters thereof are interpolated (central frequency $f_0$, quality factor Q and gain G) and upon a transition the coefficients are calculated with respect to these interpolated parameters between the initial state and the final state. Typically, it is possible to use an infinite impulse response (IIR) filter, i.e. a type of filter characterized by a response based on the values of the signal applied at the input as well as the prior values of the response that this filter may have produced. It may be used in particular an IIR filter of order 2, referred to as "biquad", whose transfer function giving the output signal y at the time instant n as a function of the input signal x at time instants n, n−1 and n−2 is given by:

$$y(n)=b_0*x(n)+b_1*x(n-1)+b_2*x(n-2)-a_1*y(n-1)-a_2*y(n-2),$$

the coefficients $a_1$, $a_2$, $b_0$, $b_1$ and $b_2$ of the transfer function coming from the parameters $f_0$, Q and G of the filter.

FIG. 6 illustrates more precisely the elements implemented by the anti-saturation module 68 for the analysis of the signal and the selection of the filters of the blocks 70 and 72.

The digitized signal e collected by the internal microphone 28 is subjected to a frequency decomposition by a set of filters 74 so as to calculate in 76 the energy $Rms_i$ of this signal e in each of its N frequency components. For example, $Rms_1$ may be the power of the microphone signal below 100 Hz, $Rms_2$ the power of the signal about 800 Hz, etc., which allows via the spectral analysis to make the distinction between various significant situations: for example, for a use of the headset in a noisy environment of the public transportation type (plane, train), the ratio between low and high frequencies is far more important than in a calmer environment such as in an office.

The obtained values $Rms_1$, $Rms_2$ . . . $Rms_N$ are applied to a state machine 78, which compares these values of energy to respective thresholds and determines as a function of these comparisons which one of the X filters of the block 70 of the feedback branch, and as the case may be (if music is present), which one of the Y filters of the block 72 of the equalization branch, must be selected.

FIG. 7 illustrates more precisely how this state machine 78 operates. The power $RMS_{acc}$ of the signal of the accelerometer present on the headset is, possibly after prefiltering, analysed on a permanent basis. If this power exceeds a predetermined threshold Threshold_a (test 80) then the state machine considers that the headset undergoes a movement liable to cause a saturation of the ANC control and triggers an anti-saturation control process, corresponding to the left part of the algorithm of FIG. 7.

On this algorithm, the parameters Activity et Attenuation are Boolean variables, whereas the parameters $Timer_1$ and $Timer_2$ are counting values of a time delay that is reset to zero by an action "Timer=0", the notation "Timer++" indicating that the algorithm lets the delay time continue. In presence of an acceleration exceeding the prescribed threshold, the state machine analyses the signal of the internal microphone 28. If the power $RMS_1$ (power of the microphone signal in a certain frequency range) exceeds a predetermined threshold Threshold_1 (test 82), then the state machine modifies the transfer function $H_{FB1}$ of the feedback branch, for example by selecting one of the X filters that has for effect to reduce the ANC attenuation in the low frequencies, and also modifies the transfer function $H_{EQ1}$ of the equalization branch to keep the same perception of the music (block 84).

In the opposite case, the power $RMS_2$ of the microphone signal in another frequency band is tested in the same way (block 82') with respect to a second threshold Threshold_2 (with Threshold_2<Threshold_1). If $RMS_2$>Threshold_2, then a modification of the transfer functions $H_{FB1}$ and $H_{EQ1}$ (block 84') is also applied, typically with an attenuation of the feedback ANC present, but less important than in the previous case. It is hence possible to test iteratively a certain number of successive thresholds (test 82"), with progressively lower thresholds, so as to choose, among the X selectable filters of the feedback branch $H_{FB1}$, the one which will optimize the compromise between the attenuation of the ANC control and the protection against the saturation of the latter (block 84").

If in all the bands the power of the signal of the internal microphone 28 is lower than the lowest threshold, it is considered that there is no risk of saturation and, after expiration of a delay of X2 seconds (test 86), the state machine deactivates the anti-saturation modules 70 and 72 (block 88).

In the hypothesis where, in the test 80, the analysis of the accelerometer signal indicates that the latter does not exceed the prescribed threshold, if the anti-saturation processing were active (test 90), then at the expiry of a delay time of X1 seconds (test 92), the control is automatically deactivated by the state machine (block 94).

The fact to deactivate the anti-saturation control and to "wake up" the latter only at the appropriate times offers the advantage of a significant economy on the electric consumption of the DSP 50, hence increasing the autonomy of the headset.

FIGS. 8 and 9 illustrate two examples of transfer functions $H_{FB1}$ applied on the feedback branch of the ANC control, without (A) and with (B) modification by the anti-saturation module 68: FIG. 8 shows, in amplitude and phase, the transfer function $H_{FB1}$ in these two cases, whereas FIG. 9 illustrates the corresponding attenuations obtained.

It is observed that the detection of an acceleration triggers an attenuation of the gain of the feedback ANC branch of the order of 12 to 15 dB at 40 Hz between the curve A (without anti-saturation control) and the curve B (with anti-saturation control). The modification is essentially operated in the low frequencies, below 150 Hz, because this is in this frequency range that the step noise resonances, etc. usually met in practice are located. Of course, the anti-saturation control reduces the performances of attenuation of the ANC control but, in counterpart, avoids the production of a very unpleasant "plop" at the output by the transducer due to the saturation of the feedback ANC control branch.

The invention claimed is:

1. An audio headset, comprising:

two earphones (10) each including a transducer (18) for the sound reproduction of an audio signal to be reproduced, said transducer being housed in an ear acoustic cavity (22);

at least one microphone adapted to deliver a picked-up signal including an acoustic noise component;

a movement sensor (64) mounted on at least one of the earphones and adapted to deliver an accelerometer signal; and a digital signal processor, DSP, (50) comprising:

a mixer, receiving as an input a signal coming from the microphone as well as said audio signal to be reproduced, and delivering as an output a signal adapted to pilot the transducer (18); and an anti-saturation module adapted to analyse concurrently i) the microphone signal delivered by the microphone and ii) the accelerometer signal delivered by the movement sensor (64), and to verify whether current characteristics of these microphone and accelerometer signals fulfil or not a first set of predetermined criteria, characterized in that:

the headset comprises an ANC active noise control system;

the microphone is an internal ANC microphone (28) placed inside the acoustic cavity (22);

the DSP (50) comprises:

a closed-loop feedback branch (36), comprising a feedback ANC filter (54) adapted to apply a filtering transfer function ($H_{FB}$) to the signal picked up by the internal ANC microphone (28); and the mixer, which receive as an input the signal delivered by the feedback branch at the output of the feedback ANC filter (54) as well as said audio signal to be reproduced, and deliver as an output said signal adapted to pilot the transducer (18); and the DSP further comprises a prevention module for preventing the effects on the feedback branch of a saturation of the signal delivered by the internal microphone (28), comprising:

the anti-saturation module adapted to analyse concurrently i) the microphone signal delivered by the microphone (28) and ii) the accelerometer signal delivered by the movement sensor (64), and to verify whether current characteristics of these microphone and accelerometer signal fulfil or not a first set of predetermined criteria; and in the feedback branch upstream from the feedback ANC filter (54), a feedback anti-saturation filter (70) selectively switchable as a function of the result of the verification of the first set of criteria.

2. The audio headset according to claim 1, wherein:

the feedback anti-saturation filter (70) is one between a plurality of selectively switchable, pre-configured filters; and the DSP (50) further comprises:

the anti-saturation module adapted to select one of the pre-configured anti-saturation filters as a function of the result of the verification of the first set of criteria.

3. The audio headset according to claim 1, wherein:

the DSP (50) further comprises:

an equalization branch, comprising an equalization filter (58) adapted to apply an equalization transfer function ($H_{EQ}$) to the audio signal to be reproduced (M) before application of the latter to the mixer; and in the equalization branch, upstream from the equalization filter (58), an equalization anti-saturation filter (72) that is selectively switchable at the same time as the feedback anti-saturation filter (70).

4. The audio headset according to claim 1, wherein:

the feedback anti-saturation filter (72) is one between a plurality of selectively switchable, pre-configured equalization filters; and the DSP (50) further comprises:

the anti-saturation module adapted to select one of the pre-configured equalisation filters as a function of the result of the verification of the first set of criteria.

5. The audio headset according to claim 1, wherein the current characteristics of the accelerometer signal comprise a value of energy ($Rms_{acc}$) of the accelerometer signal, and the predetermined criteria comprise a threshold (Threshold_a) to which is compared said value of energy.

6. The audio headset according to claim 5, wherein the current characteristics of the microphone signal comprise values of energy (Rms1, Rms2 . . . ) of the microphone signal in a plurality of respective frequency bands (Filter1, Filter 2 . . . ), and the predetermined criteria comprise a series of respective thresholds (Threshold1, Threshold2 . . . ThresholdN) to which are compared said energy values of the microphone signal if the value of energy ($Rms_{acc}$) of the accelerometer signal exceeds said threshold (Threshold_a).

7. The audio headset according to claim 1, wherein:

the feedback ANC filter (54) is one between a plurality of selectively switchable, pre-configured feedback ANC filters; and the DSP (50) further comprises:

an active noise control module for analysing the signal delivered by the internal microphone, adapted to verify whether current characteristics of the signal delivered by the internal microphone fulfil or not a second set of predetermined criteria; and a selection module, adapted to select one of the pre-configured feedback ANC filters as a function of the result of the verification of the second set of criteria.

8. The audio headset according to claim 7, wherein:

the DSP (50) further comprises:

an equalization branch, comprising an equalization filter (58) adapted to apply an equalization transfer function ($H_{EQ}$) to the audio signal to be reproduced (M) before application of the latter to the mixer;

the equalization filter (58) is one between a plurality of selectively switchable, pre-configured equalization filters, and the selection module are also adapted to select one of the pre-configured equalization filters as a function of the current selected feedback ANC filter.

* * * * *